United States Patent [19]

Novinson

[11] Patent Number: 4,832,933

[45] Date of Patent: May 23, 1989

[54] METAL TETRAIODOMERCURATES AS INFRARED DETECTORS

[75] Inventor: Thomas Novinson, Ventura, Calif.

[73] Assignee: The United States of America as represented by the Secretary of the Navy, Washington, D.C.

[21] Appl. No.: 160,945

[22] Filed: Feb. 26, 1988

[51] Int. Cl.$^4$ .................. C01G 7/00; C01G 15/00; G01J 1/50

[52] U.S. Cl. .................. 423/463; 250/338.1; 250/484.1; 252/301.4 H; 252/962; 340/786; 374/162; 436/2

[58] Field of Search .................. 423/463; 106/286.2; 252/301.4 H, 962; 250/484.1 A, 327.2 A, 338.1; 340/786; 350/353; 365/119; 374/162; 436/2

[56] References Cited

U.S. PATENT DOCUMENTS

| | | | |
|---|---|---|---|
| 817,166 | 4/1906 | England | 423/463 |
| 2,892,798 | 6/1959 | Dobbs et al. | 252/962 |
| 3,219,993 | 11/1965 | Schwertz | 340/786 |
| 3,323,241 | 6/1967 | Blair et al. | 340/786 |
| 3,352,794 | 11/1967 | Abdo | 252/962 |
| 3,561,269 | 2/1971 | Seitz | 252/962 |
| 3,665,938 | 5/1972 | Pederson | 436/2 |
| 3,760,057 | 9/1973 | Kressin | 423/463 |
| 4,412,936 | 11/1983 | Khmelkov et al. | 423/366 |

OTHER PUBLICATIONS

Handbook of Preparative Inorganic Chemistry, 2nd ed. Brauer, ed. Academic Press, 1965, vol. 2, pp. 1110-1111.
Chemical Abstract, vol. 52-10682h, 1958.
Contribution a L'Etude Des Mercuriiodures, Gallais, Ann. de Chim., 11 serie, 1938, pp. 9, 130-133, 168-175, 180-181.
The Chemistry of Thallium, Lee, Elsevier Publishing Co., 1971, pp. 168, 177.

*Primary Examiner*—John Doll
*Attorney, Agent, or Firm*—J. M. St. Amand; David S. Kalmbaugh

[57] ABSTRACT

A series of chemically synthesized compounds known as metal mercury iodides or metal tetraiodomercurates having use as infrared detectors are made by reacting potassium tetraiodomercurate(II) with monovalent metal nitrates or iodides, such as thallium(I), indium(I) or copper(I) nitrates. In the case of gold, the gold(I) iodide is used because the nitrate is not known. The precipitated metal (thallium, indium, copper, gold, etc.) tetraiodomercurate is then filtered, dried, and purified (recrystallized) and pressed into a disk under high pressure. Alternatively, the material can be grown as a large crystal by zone melt fusion methods.

10 Claims, No Drawings

METAL TETRAIODOMERCURATES AS INFRARED DETECTORS

BACKGROUND OF THE INVENTION

This invention relates to the new chemical synthesis and new use of metal tetraiodomercurates as infrared detectors in the range of 2 to 10 microns.

Galium arsenide and mercury cadmium telluride are currently used for infrared detectors in detection and visualization equipment in the range of 2 to 10 microns, but these materials are both expensive and highly toxic.

The metal tetraiodomercurates disclosed herein are a series of chemically synthesized materials that can serve as high resolution, lower cost, infrared detectors to replace galium arsenide and mercury cadmium telluride in many applications, including infrared spectrophotometers and radiometers. The infrared properties of these chemical compounds were discovered in the process of developing new thermochromic pigments for energy conserving coatings. These compounds are easily synthesized, processed and purified, and can be used over a wide variety of temperature ranges. The compounds can be pressed into disks as well as grown into crystals, thus reducing the cost of production over other materials. Silver tetraiodomercurate was previously reported as a thermochromic material, that is, the color changes from yellow to red by heating over a range of about 50 degrees C. to 100 degrees C. [K. Funke, *Prog. Solid State Chem.*, 11, 345–402 (1976)]. The color reverts to yellow when this silver compound cools to room temperature. Because of its thermochromic properties it was investigated as a pigment for paints that change color as a function of temperature. It has also been reported [J. A. A. Ketelar, *Trans. Faraday Soc.*, 34, 874–882 (1938)] that this silver compound is a non-conductor or insulator below 50 degrees C., but conducts electricity almost as well as metals, when the compound is heated above 50 degrees C. However, there have not been any reports correlating the optical properties to the electronic properties. During the investigation it was deduced that these materials might have infrared detector properties after examining the changes of optical absorption spectra (or band gap energies) over a temperature range of 0 degrees C. to 100 degrees C. Further evidence came from luminescence studies in the visible and infrared ranges during the investigation. Because of the optical and electronic correlations observed for the silver tetraiodomercurate, the originally reported synthesis in U.S. Pat. No. 2,892,798 issued June 30, 1959, was improved and new metal tetraiodomercurates were synthesized, which are useful as infrared detectors.

SUMMARY OF THE INVENTION

A series of newly synthesized chemical compounds known as metal mercury iodides or metal tetraiodomercurates, having utility as infrared detectors, are made by reacting potassium tetraiodomercurate(II) with monovalent metal nitrates or iodides, such as the thallium(I), indium(I) or copper(I) salts. In the case of gold, the aurous(I) iodide is used instead because the nitrate is not known. In the case of the other metal salts, either the iodide or nitrate may be reacted with potassium tetraiodomercurate to give the same product, that is, the corresponding metal tetraiodomercurate. The basic reactions are:

(a) $K_2HgI_4 + 2MNO_3 \rightarrow M_2HgI_4 + 2KNO_3$ (by-product)

(b) $K_2HgI_4 + 2MI \rightarrow M_2HgI_4 + 2KI$ (by-product)

where M = Ag(I), In(I), Tl(I), Li, Na, Cs, or Rb in either reaction (a) or (b); also in reaction (b) M = Au(I); and (c) $2CuSO_4 + SO_2 + K_2HgI_4 \rightarrow Cu_2HgI_4 +$ by products where Cu(II) → Cu(I).

In reaction (c), cupric sulfate for Cu(II), was reacted with potassium tetraiodomercurate in the presence of sulfur dioxide, which reduced the copper(II) salt to copper(I) in the final product, copper tetraiodomercurate.

It is an object of the invention, therefore, to provide a series of new chemically synthesized metal tetraiodomercurate compounds for use as infrared detectors.

It is a further object of the invention to provide an improved synthesis for metal tetraiodomercurates.

Other objects, advantages and novel features of the invention will become apparent from the following detailed description of the invention which follows.

DESCRIPTION OF THE PREFERRED EMBODIMENTS

The series of metal tetraiodomercurates are synthesized by reacting potassium tetraiodomercurate with either the monovalent metal nitrate or the monovalent metal iodide, and then precipitating, washing and recrystallizing the end product. The monovalent metal tetraiodomercurate is then air dried at 50 degrees C. to 110 degrees C. and pressed into a disk at high pressure. Or, the material can be grown as a large crystal by zone melt fusion methods, and then sliced into wafers for testing as thermal detectors. The crystal wafer or pressed disk is placed in the beam of an infrared light source (such as Nernst globar or similar) and lead wires soldered to the back of the crystal or disk which in turn are attached to a preamplifier, amplifier, or other signal identification electronic system. The crystal or disk is cooled to 4 to 20 degrees Kelvin using liquid nitrogen, liquid argon, liquid helium, or other source, and the electrical signal generated is measured and recorded in darkness (no light), and at 300 nanometers (ultraviolet), 500 nanometers (visible), and at 2.0, 5.0, 10.0 and 20.0 microns (all infrared). The electrical signals produced are measured as a function of photon output verses signal amplitude.

Elemental analyses, and X-ray diffraction and crystallography proved that the metal tetraiodomercurates have the same crystal structure as the originally reported silver tetraiodomercurates [K. W. Browall, *J. Solid State Chem.*, 10, 20–28 (1974)]. Synthesis of the new compounds are described below.

SYNTHESIS

A. General Metal Nitrate Method

Approximately 30 ml of deionized water was heated to 70 degrees C. in a Pyrex glass vessel (Erlenmeyer or 3-neck round bottom flask). Then 0.01 mole of potassium mercury iodide (mol. wt. 786.48, available from Morton-Thiokol, Inc., Alpha Products, Danvers, Mass.) was added to the hot water at 70 degrees C. The mixture was stirred at 70 degrees C. until a light lemon yellow solution resulted. Then 0.02 mole of the appropriate metal nitrate was added either as a solid or in approximately 30 ml of deionized water at 70 degrees C. A product precipitated of the appropriate metal tetraiodomercurate, where M=silver, lithium, cesium, rubidium, indium(I), or thallium(I) within 1 to 5 minutes.

$$2MNO_3 + K_2HgI_4 \rightarrow M_2HgI_4 + 2KNO_3$$

where M=Ag, Li, Cs, Rb, In, Tl

The mixture was stirred for approximately 1 hour to ensure that the reaction was complete. To exclude air, the reaction was performed under a blanket of nitrogen. After 1 hour the mixture was allowed to cool to room temperature. The solid, water insoluble product was filtered on Whatman No. 1 filter paper using a Büchner funnel and water aspirator vacuum. The filtered precipitate was washed with deionized water to remove starting materials and water soluble by-products. Then the filtered and washed precipitate was air dried.

Attempts to dry the reaction products in vacuo over phosphorous pentoxide led to decomposition, although more hygroscopic salts could be stored in desiccators over anhydrous calcium sulfate (Drierite) without adverse effects. Recrystallization from hot water was possible with the sparingly soluble alkali metal tetraiodomercurates (lithium, sodium, potassium, cesium, and rubidium), but not with the less soluble indium, thallium, silver, and copper salts. The insoluble salts were freed of potassium nitrate by copious washing with deionized water (sample washings were checked for nitrate using a Dionex ion chromatograph calibrated with potassium nitrate solution). Note: If the solution was not heated to 70 degrees C., the potassium mercury iodide decomposed (in cooler water). Also, if the initial reaction was not run under nitrogen, the analysis was erratic. Analysis for elemental composition is shown below:

Silver tetraiodomercurate (from silver nitrate).
Formula wt. $Ag_2HgI_4 = 923.93$.
Calc: Ag 23.35%, Hg 21.71%, I 54.94%.
Found: Ag 24.15%, Hg 23.78%, I 53.1%.
Transition Tm=48 degrees C.
Insol. water
Thermochromic (Yellow)
Yield: 70 to 75%
Indium tetraiodomercurate (from indium nitrate).
Formula wt. $In_2HgI_4 = 937.83$.
Calc: In 24.49%, Hg 21.39%, I 54.12%.
Found: In 25.0%, Hg 22.0%, I 54.8%.
Non-thermochromic (orange-red)
Yield: 5 to 7%
Thallium tetraiodomercurate (from thallium nitrate).
Formula wt. $Tl_2HgI_4 = 1116.93$.
Calc: Tl 36.59%, Hg 17.96%, I 45.44%.
Found: Tl 37.0%, Hg 18.2%, I 46.0%.
Insol. water
Non-thermochromic (orange)
Yield: 85 to 90%
Lithium tetraiodomercurate (from lithium nitrate).
Formula wt. $Li_2HgI_4 = 830.16$.
Calc: Li 1.67%, Hg 24.16%, I 61.15%.
Found: Li 2.1%, Hg 24.0%, I 62.3%.
Somewhat sol. in water
Hygroscopic
Monoclinic crystals
Non-thermochromic (pale yellow platelets)
Yield: 25 to 30%
Cesium tetraiodomercurate.
Formula wt. $Cs_2HgI_4 = 974.01$.
Calc: Cs 27.29%, Hg 20.59%, I 52.11%.
Found: Cs 28.3%, Hg 21.6%, I 53.7%.
Somewhat sol. in water (less than lithium salt)
Somewhat hygroscopic (less than lithium salt)
Non-thermochromic (canary yellow)
Yield: 25 to 30%
Rubidium tetraiodomercurate.
Formula wt. $Rb_2HgI_4 = 879.13$.
Calc: Rb 19.44%, Hg 22.82%, I 57.74%.
Found: Rb 20.5%, Hg 23.7%, I 58.3%.
Somewhat sol. in water (much less than lithium salt)
Not very hygroscopic (less than lithium and cesium salts)
Non-thermochromic (yellow plates)
Yield: 18 to 23%

B. Modified Method with Copper(II) Nitrate and Sulfur Dioxide

The procedure above was modified for copper because only copper(II) nitrate is available and water soluble, but only monovalent (in this case copper(I)) tetraiodomercurate salts were useful for infrared detection. A solution of 4.7 gm of copper(II) sulfate (0.03 mol) in 45 ml of water was added to 11.8 gm (0.015 mol) of potassium tetraiodomercurate dissolved in 50 ml water at 70 degrees C. Sulphur dioxide ($SO_2$) was bubbled directly into the solution until an orange precipitate formed. The orange solid was filtered, washed with deionized water, and air dried at 110 degrees C. The reaction is:

$$2CuSO_4 + K_2HgI_4 \xrightarrow{SO_2} Cu_2HgI_4 + \text{other by-products}$$

Copper tetriodomercurate (from cupric nitrate, then reduction). Formula wt. $Cu_2HgI_4 = 835.27$. calc: Cu 15.21%, Hg 24.01%, I 60.77%. found: Cu 15.81%, Hg 25.10%, I 61.00%.
transition Tm=70 degrees C.
insol. water
thermochomic (red)
yield: 45 to 60%

C. Method with Gold(I) and Other Metal Iodides

The reaction is $2MI + K_2HgI_4 \rightarrow M_2HgI_4 + 2KI$. This method was necessary for the gold tetraiodomercurate (since the nitrate of gold is not available) and it was also used for the indium salt as an alternative route.

A solution of 0.01 mole of potassium tetraiodomercurate was prepared in 30 ml of hot water at 70 degrees C. and stirred under a blanket of nitrogen in a 250 ml Erlenmeyer flask.

The solution was maintained at 70 degrees C. and then 0.02 mole of powdered gold(I) iodide was added in portions to the stirred solution. The aqueous mixture was heated and stirred at 70 degrees C. for 3 hours. Then the mixture was cooled and filtered. The precipitated product was washed with distilled water. The product was discolored due to iodine that was apparently released. The iodine color was discharged by washing the precipitate with a cold solution of 5% sodium thiosulfate in deionized water, followed by washing with cold deionized water. The precipitate was air dried, then placed in a desiccator over Drierite (anhydrous calcium sulfate).

Gold tetraiodomercurate. Formula wt. Au$_2$HgI$_4$=1002.13. Calc: Au 35.74%, Hg 18.20%, I 46.05%. Found: Au 35.4%, Hg 19.22%, I 45.87%.

Insol. water
Loses iodine on storage or exposure to light
Non-thermochromic (tan)
Yield: 12 to 15%

Determination of Luminescence of Metal(I) Tetraiodomercurates

The gold(I), copper(I), silver(I), indium(I) and thallium(I) tetraiodomercurates were individually ground with potassium bromide (1:10 ratio by weight) and then pressed at 20 kpsi (20,000 lb/in$^2$) under vacuum to exclude water. The resultant disks or pellets were cooled to 12 degrees Kelvin (liquid helium) and then irradiated with visible light from an argon laser (blue). The luminescence output was collected and detected with a germanium detector at 0.8 to 1.6 microns, then a lead sulfide and indium arsenide detector from 1.0 to 3.0 microns and finally silicon and germanium photoconductors from 3.0 to 10.0 microns. Experiments were also carried out at 100 degrees Kelvin and at 293 degrees Kelvin (room temperature or 25 degrees C.).

SUMMARY

Other metal iodides, such as lithium, sodium, potassium, rubidium, cesium, thallium and indium can be used in this method to make the corresponding metal tetraiodomercurates.

Indium, thallium, and gold tetraiodomercurates appear to be the most useful for use as infrared detectors.

The infrared detector materials disclosed herein are: more easily prepared than mercury cadmium telluride and gallium arsenide.

Obviously many modifications and variations of the present invention are possible in the light of the above teachings. It is therefore to be understood that within the scope of the appended claims, the invention may be practiced otherwise than as specifically described.

What is claimed is:

1. The method for synthesizing metal tetraiodomercurate compounds by the improved process comprising:
   (a) heating approximately 30 ml of deionized water to 70 degrees C.;
   (b) adding 0.01 mole of potassium tetraiodomercurate to the hot water at 70 degrees C. to form a solution;
   (c) adding the appropriate metal nitrate, selected from the group consisting of lithium nitrate, cesium nitrate, rubidium nitrate, thallium nitrate, and indium nitrate, in approximately 30 ml of deionized water, to said heated potassium tetraiodomercurate solution, and stirring the mixture for approximately 1 hour to ensure completion of the reaction;
   (d) the procedure being performed under a blanket of nitrogen, and then cooled to room temperature;
   (e) the solid products of the reaction (metal tetraiodomercurate salts) being filtered and washed to remove starting materials and water soluble by-products, and then air dried away from light.

2. The method for synthesizing metal tetraiodomercurate compounds by the improved process comprising:
   (a) preparing a solution of 0.01 mole of potassium tetraiodomercurate in 30 ml of deionized water stirred and heated to 70 degrees C. under a blanket of nitrogen;
   (b) adding 0.02 mole of the appropriate metal iodide (MI) in portions to said stirred potassium tetraiodomercurate solution, where M is selected from any of the group consisting of Li, Na, Cs, Rb, Tl, In(I), Au(I), and Ag(I);
   (c) heating the mixture at 70 degrees C. and maintaining that temperature for 1 to 3 hours;
   (d) filtering the precipitated product, which is metal(I) tetraiodomercurate, washing the precipitated product with water to remove any starting materials and water soluble by-products, and then air drying the precipitated product.

3. The method for synthesizing the compound gold tetraiodomercurate by the improved process comprising:
   (a) preparing a solution of 0.01 mole of potassium tetraiodomercurate in 30 ml of deionized water stirred and heated to 70 degrees C. under a blanket of nitrogen;
   (b) adding 0.02 mole of powdered gold(I) iodide in portions to said stirred potassium tetraiodomercurate solution;
   (c) heating the aqueous solution at 70 degrees C. and maintaining that temperature for 3 hours;
   (d) the precipitated insoluble gold tetraiodomercurate compound formed being filtered, washed with deionized water to remove any potassium nitrate, and then air dried away from light.

4. The metal(I) tetraiodomercurate compound, indium(I) tetraiodomercurate, which is synthesized by the process comprising:
   (a) heating approximately 30 ml of deionized water to 70 degrees C.;
   (b) adding 0.01 mole of potassium tetraiodomercurate to the hot water at 70 degrees C. to form a solution;
   (c) adding indium nitrate, in approximately 30 ml of deionized water, to said heated potassium tetraiodomercurate solution, and stirring the mixture for approximately 1 hour to ensure completion of the reaction;
   (d) the procedure being performed under a blanket of nitrogen, and then cooled to room temperature;
   (e) the solid products of the reaction (indium(I) tetraiodomercurate salts) being filtered and washed to remove starting materials and water soluble by-products, and then air dried away from light.

5. The metal(I) tetraiodomercurate compound, indium(I) tetraiodomercurate, which is synthesized by the process comprising:
   (a) preparing a solution of 0.01 mole of potassium tetraiodomercurate in 30 ml of deionized water stirred and heated to 70 degrees C. under a blanket of nitrogen;
   (b) adding 0.02 mole of indium(I) iodide in small portions to said stirred potassium tetraiodomercurate solution;
   (c) heating the mixture at 70 degrees C. and maintaining that temperature for 1 to 3 hours;
   (d) filtering the precipitated product, which is indium(I) tetraiodomercurate, washing the precipitated product with water to remove any starting materials and water soluble by-products, and then air drying the precipitated product.

6. The metal tetraiodomercurate compound, gold(I) tetraiodomercurate, which is synthesized by the process comprising:
   (a) preparing a solution of 0.01 mole of potassium tetraiodomercurate in 30 ml of deionized water stirred and heated to 70 degrees C. under a blanket of nitrogen;

(b) adding 0.02 mole of powdered gold(I) iodide in portions to said stirred potassium tetraiodomercurate solution;

(c) heating the aqueous solution at 70 degrees C. and maintaining that temperature for 3 hours;

(d) the precipitated insoluble gold tetraiodomercurate compound formed being filtered, washed with deionized water to remove any potassium nitrate, and then air dried away from light.

7. An infrared detector comprising:

(a) a metal (I) tetraiodomercurate selected from the group consisting of indium (I) tetraiodomercurate and thallium (I) tetraiodomercurate;

(b) means for placing said metal (I) tetraiodomercurate in the beam of an infrared light source;

(c) means for cooling said metal (I) tetraiodomercurate to a temperature of 4 to 20 degrees Kelvin; and (d) means for measuring the electrical signal generated by said cooled metal (I) tetraiodomercurate when said cooled metal (I) tetraiodomercurate is placed in the beam of said infrared light source.

8. An infrared detector as in claim, 7 wherein the metal(I) tetraiodomercurate compound selected from the group consisting of indium(I) tetraiodomercurate and thallium(I) tetraiodomercurate is formed under pressure and under vacuum into a shape suitable for use as an infrared detector.

9. An infrared detector as in claim, 7 wherein said metal (I) tetraiodomercurate compound is selected form the group consisting of indium(I) tetraiodomercurate and thallium(I) tetraiodomercurate grown as crystals by zone melt fusion, and said metal tetraiodomercurate crystals being sliced into smaller sized crystal wafers suitable for use as infrared detectors.

10. An infrared detector as in claim 7, wherein the monovalent metal tetraiodomercurate compound is formed into a desired shape for use as an infrared detector; electrical wire leads are attached to the shaped infrared detector; said shaped infrared detector being irradiated with visible to infrared light (0.300 to 3.00 microns), and the changes in electrical output and luminescence spectra collected and detected.

* * * * *